US012769203B2

(12) United States Patent
Hong et al.

(10) Patent No.: US 12,769,203 B2
(45) Date of Patent: Oct. 20, 2026

(54) RESIST COMPOSITION AND METHOD OF MANUFACTURING SEMICONDUCTOR DEVICE USING THE SAME

(71) Applicant: SAMSUNG ELECTRONICS CO., LTD., Suwon-si (KR)

(72) Inventors: Suk Koo Hong, Suwon-si (KR); Moo Hyun Koh, Suwon-si (KR); Kyungoh Kim, Suwon-si (KR); Jaemyoung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 712 days.

(21) Appl. No.: 18/127,118

(22) Filed: Mar. 28, 2023

(65) Prior Publication Data

US 2024/0069437 A1 Feb. 29, 2024

(30) Foreign Application Priority Data

Aug. 30, 2022 (KR) ........................ 10-2022-0109409

(51) Int. Cl.

*G03F 7/004* (2006.01)
*H10P 76/20* (2026.01)

(52) U.S. Cl.

CPC ........ *G03F 7/0042* (2013.01); *H10P 76/2041* (2026.01)

(58) Field of Classification Search

CPC ..... G03F 7/0042; G03F 7/004; H10P 76/2041
See application file for complete search history.

(56) References Cited

U.S. PATENT DOCUMENTS

| | | | |
|---|---|---|---|
| 9,372,402 B2 | 6/2016 | Freedman et al. | |
| 10,642,153 B2 | 5/2020 | Meyers et al. | |
| 11,054,742 B2 | 7/2021 | Zi et al. | |
| 11,215,924 B2 | 1/2022 | Zi et al. | |
| 2016/0116839 A1* | 4/2016 | Meyers | G03F 7/0043 430/326 |
| 2020/0333707 A1* | 10/2020 | Tamada | G03F 7/168 |
| 2020/0371439 A1 | 11/2020 | Meyers et al. | |
| 2021/0048745 A1 | 2/2021 | Meyers et al. | |
| 2021/0063876 A1 | 3/2021 | Zi et al. | |
| 2021/0157233 A1 | 5/2021 | Zi et al. | |

* cited by examiner

*Primary Examiner* — Keith Walker
*Assistant Examiner* — Alexander N. Lee
(74) *Attorney, Agent, or Firm* — Muir Patent Law, PLLC

(57) ABSTRACT

A resist composition and a method of manufacturing a semiconductor device, the resist composition includes an organometallic compound, the organometallic compound including a central metal and ligands combined with the central metal; and an excess ligand compound, the excess ligand compound being combinable with the central metal via a coordination bond.

14 Claims, 6 Drawing Sheets

RESIST COMPOSITION AND METHOD OF MANUFACTURING SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application No. 10-2022-0109409, filed on Aug. 30, 2022, in the Korean Intellectual Property Office, the entire contents of which are hereby incorporated by reference.

BACKGROUND

1. Field

Embodiments relate to a resist composition for photolithography used for manufacturing a semiconductor device, and a method of manufacturing a semiconductor device using the same.

2. Description of the Related Art

Photolithography may include an exposure process and a developing process. Performing the exposure process may include irradiating light of a specific wavelength to a resist layer to induce a change in a chemical structure of the resist layer. Performing the developing process may include selectively removing an exposed portion or an unexposed portion of the resist layer by using a difference in solubility between the exposed portion and the unexposed portion.

SUMMARY

The embodiments may be realized by providing a resist composition including an organometallic compound, the organometallic compound including a central metal and ligands combined with the central metal; and an excess ligand compound, the excess ligand compound being combinable with the central metal via a coordination bond.

The embodiments may be realized by providing a method of manufacturing a semiconductor device, the method including forming a photoresist layer by applying a resist composition on a lower layer; and performing an exposure process on the photoresist layer, wherein the resist composition includes an organometallic compound, the organometallic compound including a central metal and ligands combined with the central metal; and an excess ligand compound, the excess ligand compound being combinable with the central metal via a coordination bond.

The embodiments may be realized by providing a method of manufacturing a semiconductor device, the method including forming a photoresist layer by applying a resist composition on a lower layer; and performing an exposure process using extreme ultraviolet on the photoresist layer, wherein the resist composition includes an organometallic compound, the organometallic compound including a central metal and ligands combined with the central metal; and an excess ligand compound, the excess ligand compound being combinable with the central metal via a coordination bond, and wherein a type and a ratio of ligands combined with the central metal of the organometallic compound are adjusted by selecting different types of the excess ligand compound and a ratio between the different types of the excess ligand compound in the resist composition.

BRIEF DESCRIPTION OF THE DRAWINGS

Features will be apparent to those of skill in the art by describing in detail exemplary embodiments with reference to the attached drawings in which.

DETAILED DESCRIPTION

In the present specification, an alkyl group may be a linear alkyl group, a branched alkyl group, or a cyclic alkyl group. In an implementation, a number of carbon atoms in the alkyl group may be, e.g., 1 to 20 carbon atoms. In an implementation, the alkyl group may include, e.g., a methyl group, an ethyl group, or a propyl group. As used herein, the term "or" is not an exclusive term, e.g., "A or B" would include A, B, or A and B.

In the present specification, a halogen group may include, e.g., fluorine (F), chlorine (Cl), bromine (Br), or iodine (I).

Figure 1:
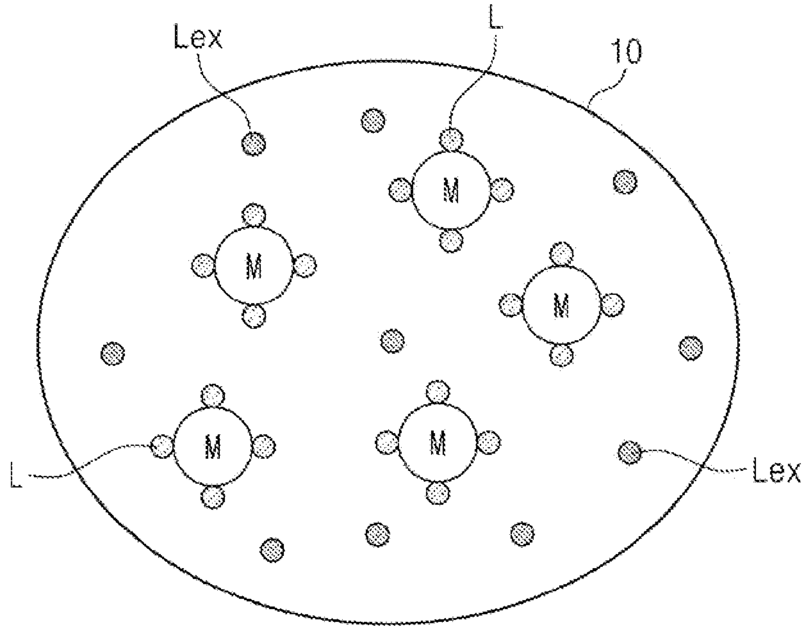
FIG. 1 is a conceptual diagram illustrating a resist composition according to embodiments.

FIG. 1 is a conceptual diagram illustrating a resist composition according to embodiments.

Referring to FIG. 1, a resist composition 10 according to embodiments may be used in manufacturing a semiconductor device, e.g., may be used in a photolithography process for manufacturing the semiconductor device. The resist composition 10 may be used, e.g., in extreme ultraviolet, long-wavelength ultraviolet, or e-beam lithography. The extreme ultraviolet may refer to ultraviolet rays or radiation having a wavelength of 10 nm to 124 nm, e.g., a wavelength of 13.0 nm to 13.9 nm, or a wavelength of 13.4 nm to 13.6 nm. The long-wavelength ultraviolet rays may refer to ultraviolet rays having a wavelength of approximately 360 nm to 370 nm.

The resist composition 10 may include an organometallic compound and a ligand compound. The organometallic compound may include, e.g., a central metal "M" and ligands "L" combining with the central metal "M". The central metal "M" may include, e.g., tin (Sn), antimony (Sb), indium (In), tellurium (Te), hafnium (Hf), zinc (Zn), titanium (Ti), lithium (Li), sodium (Na), potassium (K), beryllium (Be), magnesium (Mg), calcium (Ca), barium (Ba), aluminum (Al), silicon (Si), cadmium (Cd), mercury (Hg), chromium (Cr), iron (Fe), cobalt (Co), nickel (Ni), copper (Cu), germanium (Ge), palladium (Pd), platinum (Pt), lead (Pb), strontium (Sr), or manganese (Mn).

The ligands "L" may combine with the central metal "M" via a coordination bond. In an implementation, each of the ligands "L" may have at least one binding site capable of combining with the central metal "M" in one molecule via a coordination bond. Each of the ligands "L" may include a functional group, e.g., an alkyl (e.g., propyl, butyl, or the like), aryl (e.g., phenyl, benzyl, or the like), carboxylic acid (R—COOH, e.g., propionic acid, hexanoic acid, or the like), carboxylate (R—COO—), carbonic acid or carbonyl acid ($H_2CO_3$), carbonate ($H[CO_3]^-$, $[CO_3]^{-2}$), phosphoric acid ($H_3PO_4$)), phosphate ($H_2[PO_4]^{31}$, $H[PO_4]^{-2}$, $[PO_4]^{-3}$), carbonyl group (R—CO—$R^1$), amide (R—C(=O)$NR^2R^3$, R—S(=O)$_2NR^2R^3$, R—P(=O)$NR^2R^3$), amine (R—$NR^2R^3$), diamine ($H_2N$—R—$NH_2$), sulfonic acid (R—S(=O)$_2$OH), sulfonate, R—S(=O)$_2O^-$), alcohol, pyridine, phenol, or phenolate. In an implementation, the ligands "L" may be or include, e.g., a multidentate ligand (e.g., bipyridine, salen, porphyrin, malic acid, ethylene-diamine-tetraacetic acid, or the like) including two or more functional groups. In an implementation, "R may be, e.g., is an alkyl group having 1 to 20 carbon atoms, an alkyl group having 1 to 20 carbon atoms in which at least one hydrogen is substituted with a halogen group, an aryl group having 6 to 20 carbon atoms, or an aryl group having 6 to 20 carbon atoms in which at least one hydrogen is substituted with a halogen group. "$R^1$", "$R^2$", and "$R^3$" may each independently be or include, e.g., hydrogen, an alkyl group having 1 to 20 carbon atoms, an alkyl group having 1 to 20 carbon atoms in which at least one hydrogen is substituted with a halogen group, an aryl group having 6 to 20 carbon atoms, or an aryl group having 6 to 20 carbon atoms in which at least one hydrogen is substituted with a halogen group.

The ligand compound may include a material that provides excess ligands Lex in the resist composition 10. The ligand compound may include the excess ligands Lex, and the excess ligands Lex may include functional groups capable of combining with the central metal "M" of the organometallic compound via a coordination bond. In an implementation, each of the excess ligands Lex may include a functional group, e.g., alkyl (e.g., propyl, butyl, or the like), aryl (e.g., phenyl, benzyl, or the like), carboxylic acid (R—COOH, e.g., propionic acid, hexanoic acid, or the like), carboxylate (R—COO—), carbonic acid or carbonyl acid ($H_2CO_3$), carbonate ($H[CO_3]^-$, $[CO_3]^{-2}$), phosphoric acid ($H_3PO_4$), phosphate ($H_2[PO_4]^{31}$, $H[PO_4]^{-2}$, $[PO_4]^{-3}$), carbonyl group (R—CO—$R^1$), amide (R—C(=O)$NR^2R^3$, R—S(=O)$_2NR^2R^3$, R—P(=O)$NR^2R^3$), amine (R—$NR^2R^3$), diamine ($H_2N$—R—$NH_2$), sulfonic acid (R—S(=O)$_2$OH), sulfonate (R—S(=O)$_2O^-$), alcohol, pyridine, phenol, or phenolate. In an implementation, the excess ligand Lex may be or may include, e.g., a multidentate ligand (e.g., bipyridine, salen, porphyrin, malic acid, ethylene-diamine-tetraacetic acid, or the like) including two or more functional groups.

In an implementation, at least some of the excess ligands Lex may be different from the ligands "L" combining with the central metal "M" (e.g., in the organometallic compound). In an implementation, at least some of the excess ligands Lex may have different functional groups from the ligands "L" combining with the central metal "M". A type of the excess ligands Lex may be variously selected from within the above-described functional groups, and a ratio between (e.g., different types of) the excess ligands Lex may be variously adjusted.

In the resist composition 10, a molar ratio of the organometallic compound to the ligand compound may be in a range of about 1:0.1 to about 1:10.

Figure 2:
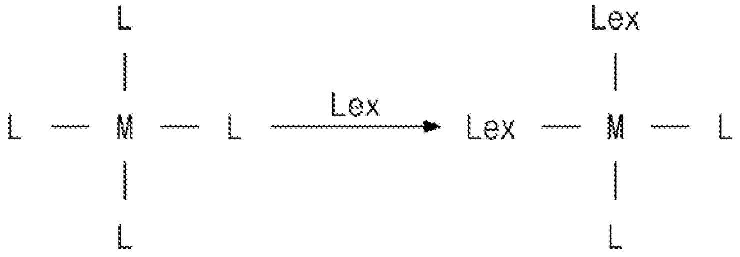
FIG. 2 is a conceptual diagram illustrating a ligand exchange reaction in a resist composition according to embodiments.

FIG. 2 is a conceptual diagram illustrating a ligand exchange reaction in a resist composition according to embodiments.

Referring to FIGS. 1 and 2, the excess ligands Lex may be in the resist composition 10, and accordingly, at least one of the ligands "L" combining with the central metal "M" of the organometallic compound may be substituted with (e.g., replaced by) at least one of the excess ligands Lex. The type of the excess ligands Lex and the ratio between the (e.g., different types of) excess ligands Lex may be adjusted, and thus a type and a ratio of the ligands "L" and Lex combining with the central metal "M" of the organometallic compound may be adjusted. Accordingly, photosensitivity of the resist composition 10 may be adjusted.

Figure 3:
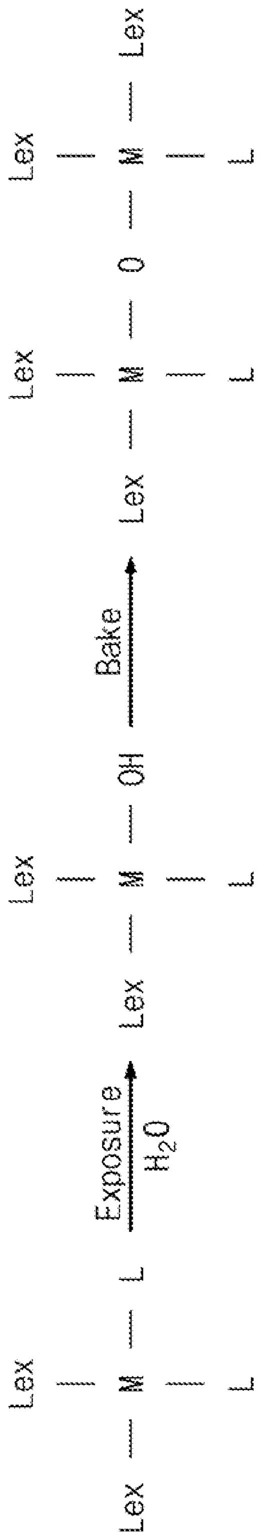
FIG. 3 is a conceptual diagram illustrating a crosslinking reaction in a resist composition according to embodiments.

FIG. 3 is a conceptual diagram illustrating a crosslinking reaction in a resist composition according to embodiments.

Referring to FIGS. 1 to 3, when an exposure process is performed on the resist composition 10, at least one of the ligands "L" and Lex combining with the central metal "M" of the organometallic compound may be dissociated into a radical form by secondary electrons generated by the exposure process, and the central metal "M" of the organometallic compound may react with water. Accordingly, the organometallic compound may have an —OH group combined with (e.g., bonded or otherwise associated with) the central metal "M". In a post-exposure bake process, a dehydration condensation reaction may proceed between the organometallic compounds having —OH groups, and accordingly, the central metals "M" of the organometallic compounds may be cross-linked by —O— linking groups. The organometallic compounds may form a network structure by crosslinking, and accordingly, solubility of the resist composition 10 may decrease.

Reactivity between the central metal "M" of the organometallic compound and water during the exposure process may be adjusted, depending on the type and ratio of the ligands "L" and Lex combining with the central metal "M" of the organometallic compound. As a result, an amount of light irradiation in the exposure process may vary. In an implementation, when the ratio of a ligand having a relatively large size (bulkiness) among the ligands "L" and Lex combining with the central metal "M" of the organometallic compound increases, reactivity between the central metal "M" and water may be reduced by steric hindrance, and thus an increase in light irradiation amount in the exposure process may be required. Accordingly, the type and ratio of the ligands "L" and Lex that combine with the central metal "M" of the organometallic compound may be adjusted, thereby adjusting the photosensitivity of the resist composition 10.

Experimental Example: Control of Photosensitivity of Resist Composition 10

In an implementation, the resist composition 10 may be formed by adding the ligand compound to the organometallic compound. The organometallic compound may include tin compound having butyl group combined with tin. The ligand compound may include the excess ligands Lex, and the excess ligands Lex may include first excess ligands and second excess ligands that are different from each other. The first excess ligand and the second excess ligand may each have different functional groups among the functional groups described above. In an implementation, the bulkiness of the second excess ligand may be greater than the bulkiness of the first excess ligand. The first excess ligand may include propyl group, and the second excess ligand may include phenol group. The photosensitivity of the resist compositions 10 to extreme ultraviolet (EUV) radiation or rays was evaluated depending on a ratio between the first ligand and the second ligand.

TABLE 1

| Molar Ratio | La:Lb = 9:1 | La:Lb = 9:1.3 | La:Lb = 9:1.6 |
|---|---|---|---|
| Dose(mJ/cm$^2$) | 148.3 | 157.7 | 169.7 |

In Table 1, La is the first excess ligand and Lb is the second excess ligand.

Referring to Table 1, as the ratio of the second excess ligand Lb (having a relatively large bulkiness) increased, the dose of extreme ultraviolet (EUV) also increased. That is, as the ratio of the second excess ligand (Lb) having a relatively large bulkiness decreased, the dose of extreme ultraviolet (EUV) (e.g., to adequately expose the composition and cause the developing reaction to proceed) also decreased, and the photosensitivity of the resist composition 10 to extreme ultraviolet (EUV) increased. It may be seen that the photosensitivity of the resist composition 10 to extreme ultraviolet (EUV) may be adjusted depending on the selected ratio between the first excess ligand and the second excess ligand.

Figure 4:
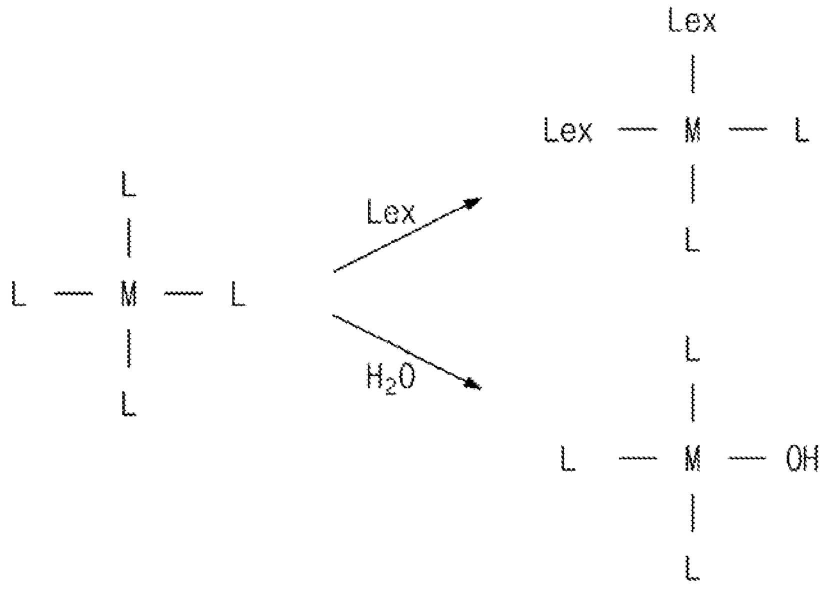
FIG. 4 is a conceptual diagram illustrating a competitive reaction in a resist composition according to embodiments.

FIG. 4 is a conceptual diagram illustrating a competitive reaction in a resist composition according to embodiments.

Referring to FIG. 4, even when an exposure process is not performed on the resist composition 10, an addition reaction in which the central metal "M" of the organometallic compound reacts with water may proceed. A —OH group combining with the central metal "M" of the organometallic compound may be generated by the addition reaction. It may cause instability of the resist composition 10 and a change in size of resist patterns formed using the resist composition 10.

According to embodiments, the excess ligands Lex may be in the resist composition 10, and an exchange reaction in which at least one of the ligands "L" combining with the central metal "M" of the organometallic compound is substituted with at least one of the excess ligands Lex may proceed. The addition reaction (e.g., the reaction with water) may be inhibited by using the exchange reaction as a competitive reaction. Accordingly, stability of the resist composition 10 may increase, and a change in size of resist patterns formed using the resist composition 10 may decrease.

Figure 5A:
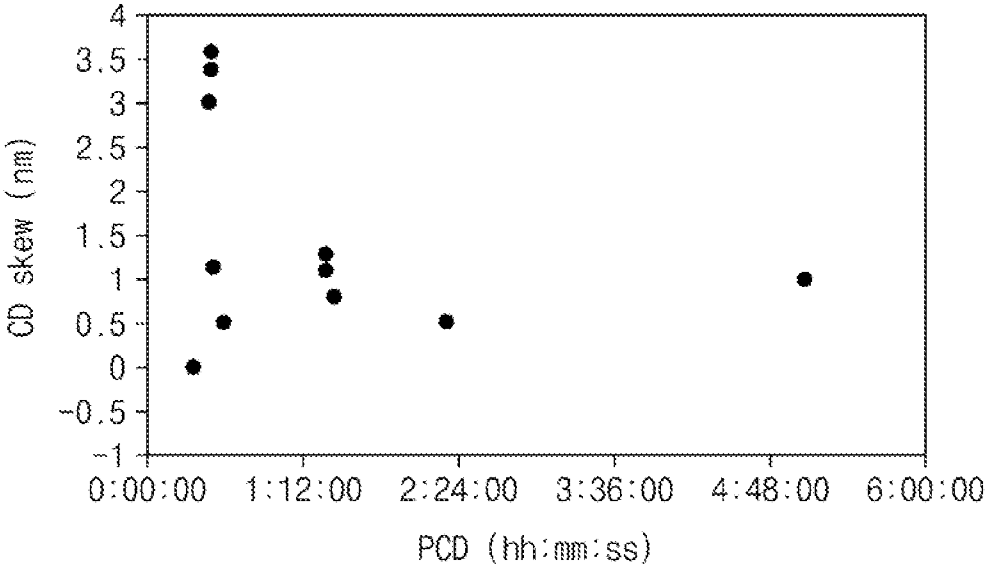
FIGS. 5A and 5B are graphs illustrating a size change of resist patterns according to a post coating delay (PCD).
Figure 5B:
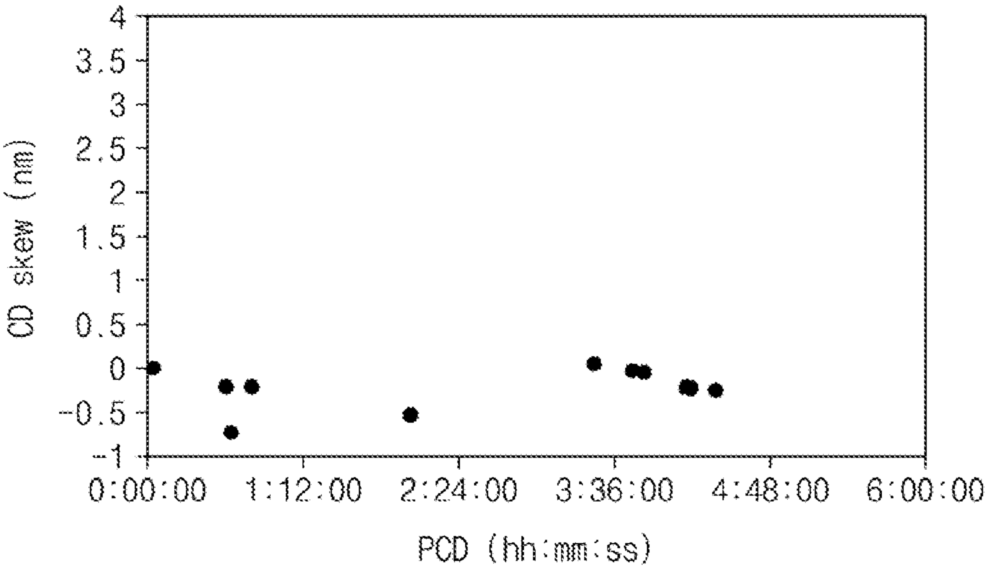

FIGS. 5A and 5B are graphs illustrating a size change of resist patterns according to a post coating delay (PCD).

FIG. 5A is a graph illustrating CD skew of resist patterns according to a post coating delay (PCD) when the excess ligands Lex are not included in the resist composition 10. FIG. 5B is a graph illustrating CD skew of resist patterns according to a post coating delay (PCD) when the excess ligands Lex are included in the resist composition 10. Referring to FIGS. 5A and 5B, when the excess ligands Lex are included in the resist composition 10, it may be seen that the size change of resist patterns due to post coating delay (PCD) is reduced.

FIGS. 6 to 9 are cross-sectional views of stages in a method of manufacturing a semiconductor device using a resist composition according to embodiments.

Figure 6:
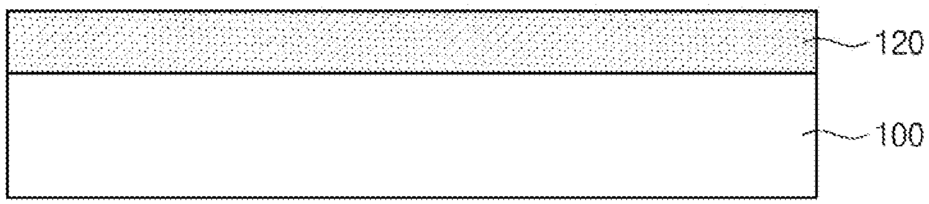
FIGS. 6 to 9 are cross-sectional views of stages in a method of manufacturing a semiconductor device using a resist composition according to embodiments.

Referring to FIG. 6, a photoresist layer 120 may be formed on a lower layer 100. The lower layer 100 may be an etch target layer, and may be formed of a semiconductor material, a conductive material, an insulating material, or a combination thereof. The lower layer 100 may be formed as a single layer or may include a plurality of stacked layers.

The photoresist layer 120 may be formed using the resist composition 10 according to embodiments. As described with reference to FIG. 1, the resist composition 10 may include the organometallic compound and the ligand compound. The organometallic compound may include the central metal "M" and the ligands "L" combining with the central metal "M", and the ligand compound may include the excess ligands Lex capable of combining with the central metal "M" of the organometallic compound via a coordination bond. By the ligand exchange reaction in the resist composition 10 described with reference to FIG. 2, at least one of the ligands "L" combined with the central metal "M" of the organometallic compound may be substituted or replaced with at least one of the excess ligand Lex. The type of the excess ligands Lex and the ratio between the (e.g., different types of) excess ligands Lex in the resist composition 10 may be adjusted, and thus the type and ratio of the ligands "L" and Lex combining with the central metal "M" of the organometallic compound may be adjusted.

Forming the photoresist layer 120 may include applying the resist composition 10 on the lower layer 100. The applying of the resist composition 10 may be performed using, e.g., a spin coating method, an aerosol coating method, or the like. The forming of the photoresist layer 120 may further include performing a heat treatment process (e.g., a soft bake process) on the applied resist composition 10.

Figure 7:
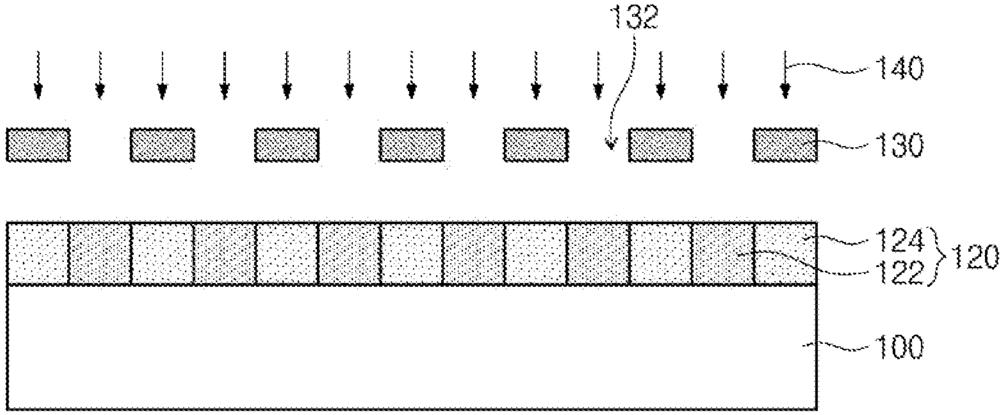

Referring to FIG. 7, an exposure process may be performed on the photoresist layer 120. The exposure process may include aligning a photomask 130 on the photoresist layer 120, and irradiating light 140 onto the photoresist layer 120 through the photomask 130. The light 140 may be, e.g., an electron beam, extreme ultraviolet, or long-wavelength ultraviolet. The photoresist layer 120 may include a first portion 122 exposed to the light 140 and a second portion 124 not exposed to the light 140. The light 140 may be irradiated to the first portion 122 through an opening 132 of the photomask 130, and may be blocked by the photomask 130, to not be irradiated to the second portion 124. After the exposure process, the photomask 130 may be removed. A post-exposure bake (PEB) may be performed on the exposed photoresist layer 120.

In the first portion 122 of the photoresist layer 120, as described with reference to FIG. 3, at least one of the ligands "L" and Lex combining with the central metal "M" of the organometallic compound may be dissociated in a radical form by secondary electrons generated by the exposure process, and the central metal "M" of the organometallic compound may react with water. Accordingly, the organometallic compound may have an —OH group combining with the central metal "M". By the post-exposure bake process, a dehydration condensation reaction may proceed between the organometallic compounds having —OH groups, and thus, the central metals "M" of the organometallic compounds may be cross-linked by an —O— linking group. The first portion 122 of the photoresist layer 120 may include a structure in which the central metals "M" of the organometallic compounds are cross-linked by the —O— linking group. Due to cross-linking of the organometallic compounds, solubility of the first portion 122 of the photoresist layer 120 may decrease.

In the second portion 124 of the photoresist layer 120, as described with reference to FIG. 4, an addition reaction in which the central metal "M" of the organometallic compound react with water, and an exchange reaction in which at least one of the ligands "L" combining with the central metal "M" is substituted with at least one of the excess ligands Lex may proceed. The addition reaction may be inhibited by using the exchange reaction as a competitive reaction. Accordingly, generation of an —OH group bonding with the central metal "M" of the organometallic compound in the second portion 124 of the photoresist layer 120 may be suppressed. The second portion 124 of the photoresist layer 120 may include a structure in which at least one of the ligands "L" combining with the central metal "M" of the organometallic compound is substituted with at least one of the excess ligands Lex. The generation of —OH group combining with the central metal "M" of the organometallic compound in the second portion 124 of the photoresist layer 120 may be suppressed, and crosslinking of the organic metal compounds in the second portion 124 of the photoresist layer 120 may be inhibited during the post-exposure bake process. Accordingly, a difference in solubility between the first portion 122 and the second portion 124 of the photoresist layer 120 may increase.

Figure 8:
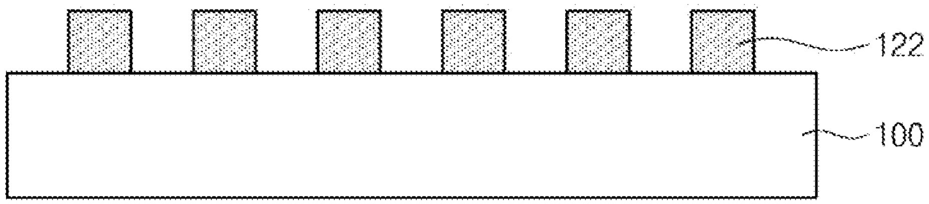

Referring to FIG. 8, a developing process may be performed on the exposed photoresist layer 120. Performing the developing process may include removing the second portion 124 of the photoresist layer 120 using a developer. The first portion 122 of the photoresist layer 120 may be referred to as a photoresist pattern. The developer may include, e.g., an organic solvent, a surfactant, or a chelating agent that forms a strong coordination bond with the organometallic compound. By the developing process, the second portion 124 of the photoresist layer 120 may be selectively removed, and the photoresist pattern 122 may have a negative tone pattern. After the developing process, an additional baking process may be performed to remove the residual solvent and to promote additional crosslinking of the organometallic compounds in the photoresist pattern 122.

Figure 9:
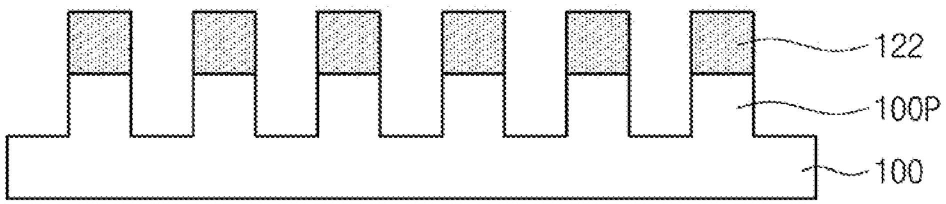

Referring to FIG. 9, the lower layer 100 may be etched using the photoresist pattern 122 as an etch mask. Etching the lower layer 100 may include, e.g., performing a wet or dry etching process. An upper portion of the lower layer 100 may be etched to form a lower pattern 100P. After the lower pattern 100P is formed, the photoresist pattern 122 may be removed. The lower pattern 100P may be a semiconductor pattern, a conductive pattern, or an insulating pattern in a semiconductor device.

According to an embodiment, the resist composition 10 may include the organometallic compound and the excess ligands Lex. The organometallic compound may include the central metal "M" and the ligands "L" combining with the central metal "M", and the excess ligands Lex may include the functional groups capable of combining with the central metal "M" of the organometallic compound via coordination bond. At least one of the ligands "L" combining with the central metal "M" of the organometallic compound may be replaced with at least one of the excess ligands Lex. The type of the excess ligands Lex and the ratio between the (e.g., different types of) excess ligands Lex may be adjusted, the type and ratio of ligands "L" and Lex combining with the central metal "M" of the organometallic compound may be adjusted. Accordingly, the photosensitivity of the resist composition 10 may be adjusted.

In addition, the addition reaction in which the central metal "M" of the organometallic compound reacts with the water in the resist composition 10, and the exchange reaction in which at least one of the ligands "L" combining with the central metal "M" of the organometallic compound is replaced with at least one of the excess ligands Lex may proceed. The addition reaction may be inhibited by using the exchange reaction as a competitive reaction. Accordingly, the stability of the resist composition 10 may increase, and the change in size of the resist patterns formed using the resist composition 10 may decrease.

Accordingly, the resist composition 10 having improved stability and easily controlling photosensitivity, and the method of manufacturing the semiconductor device using the same may be provided.

By way of summation and review, a semiconductor device may be highly integrated and miniaturized, and a critical dimension of a pattern in the semiconductor device may be miniaturized. For a formation of fine patterns, improving resolution and sensitivity of a resist pattern formed by photolithography has been considered.

According to an embodiment, the resist composition may include the organometallic compound and the excess of ligands. The organometallic compound may include the central metal and the ligands combining with the central metal, and the excess ligands may include the functional groups capable of combining with the central metal of the organometallic compound. At least one of the ligands combining with the central metal of the organometallic compound may be substituted with at least one of the excess ligands. The type of the excess ligands and the ratio between the (e.g., different types of) excess ligands may be adjusted, and thus the type and ratio of ligands combining with the central metal of the organometallic compound may be adjusted. Accordingly, the photosensitivity of the resist composition may be adjusted.

In addition, the addition reaction in which the water reacts with the central metal of the organometallic compound in the resist composition, and the exchange reaction in which at least one of the ligands combining with the central metal of the organometallic compound is replaced with at least one of the excess ligands may proceed. The addition reaction may be inhibited by using the exchange reaction as the competitive reaction. Accordingly, the stability of the resist composition may be increased, and the change in size of the resist patterns formed using the resist composition may be reduced.

Accordingly, the resist composition having the improved stability and easily controlling photosensitivity, and the method of manufacturing the semiconductor device using the resist composition may be provided.

One or more embodiments may provide a resist composition having improved stability and easily controlling photosensitivity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:

forming a photoresist layer by applying a resist composition on a lower layer; and performing an exposure process on the photoresist layer, wherein the resist composition includes:

an organometallic compound, the organometallic compound including a central metal and ligands combined with the central metal; and an excess ligand compound comprising a first excess ligand and a second excess ligand that are not combined with any central metal, wherein the first excess ligand and the second excess ligand have different functional groups from each other, wherein a bulkiness of the first excess ligand is different from a bulkiness of the second excess ligand.

2. The method as claimed in claim 1, wherein the first excess ligand and the second excess ligand are different from the ligands combined with the central metal.

3. The method as claimed in claim 1, wherein performing the exposure process includes replacing at least one of the ligands combined with the central metal with at least one excess ligand selected from the first excess ligand and the second excess ligand of the excess ligand compound.

4. The method as claimed in claim 1, wherein performing the exposure process includes applying extreme ultraviolet radiation, and wherein a ratio between the first excess ligand and the second excess ligand is adjusted to increase photosensitivity of the resist composition.

5. The method as claimed in claim 1, further comprising performing a bake process after performing the exposure process on the photoresist layer, wherein the photoresist layer includes a first portion exposed by the exposure process, and a second portion not exposed by the exposure process, and wherein the first portion includes a structure in which the central metal of the organometallic compound is cross-linked with a central metal of a neighboring organometallic compound.

6. The method as claimed in claim 5, wherein the second portion includes a structure in which at least one of the ligands combined with the central metal of the organometallic compound has been replaced with at least one of the first excess ligand and the second excess ligand of the excess ligand compound.

7. The method as claimed in claim 5, further comprising selectively removing the second portion of the photoresist layer by performing a developing process.

8. The method as claimed in claim 1, wherein the central metal includes tin (Sn), antimony (Sb), indium (In), tellurium (Te), hafnium (Hf), zinc (Zn), titanium (Ti), lithium (Li), sodium (Na), potassium (K), beryllium (Be), magnesium (Mg), calcium (Ca), barium (Ba), aluminum (Al), silicon (Si), cadmium (Cd), mercury (Hg), chromium (Cr), iron (Fe), cobalt (Co), nickel (Ni), copper (Cu), germanium (Ge), palladium (Pd), platinum (Pt), lead (Pb), strontium (Sr), or manganese (Mn).

9. The method as claimed in claim 1, wherein the ligands combined with the central metal include an alkyl, an aryl, a carboxyl acid, a carboxylate, a carbonic acid, a carbonate, a phosphoric acid, a phosphate, a carbonyl group, an amide, an amine, a diamine, a sulfonic acid, a sulfonate, an alcohol, a pyridine, a phenol, or a phenolate.

10. The method as claimed in claim 9, wherein:

functional groups of the first excess ligand and the second excess ligand are selected from an alkyl, an aryl, a carboxyl acid, a carboxylate, a carbonic acid, a carbonate, a phosphoric acid, a phosphate, a carbonyl group, an amide, an amine, a diamine, a sulfonic acid, a sulfonate, alcohol, a pyridine, a phenol, or a phenolate.

11. A method of manufacturing a semiconductor device, the method comprising:

forming a photoresist layer by applying a resist composition on a lower layer; and performing an exposure process using extreme ultraviolet on the photoresist layer, wherein the resist composition includes:

an organometallic compound, the organometallic compound including a central metal and ligands combined with the central metal; and an excess ligand compound comprising a first excess ligand and a second excess ligand that are not combined with any central metal, and wherein a bulkiness of the first excess ligand is different from a bulkiness of the second excess ligand.

12. The method as claimed in claim 11, wherein:

the photoresist layer includes a first portion exposed by the exposure process, and a second portion not exposed by the exposure process, the first portion includes a structure in which a central metal of one organometallic compound is cross-linked with a central metal of a neighboring organometallic compound, and the second portion includes a structure in which at least one of the ligands combined with the central metal of the organometallic compound is replaced with at least one excess ligand selected from the first excess ligand and the second excess ligand of the excess ligand compound.

13. The method as claimed in claim 12, further comprising selectively removing the second portion of the photoresist layer by performing a developing process.

14. The method of claim 1, wherein a molar ratio between the first excess ligand and the second excess ligand is between 9 to 1 and 9 to 1.6.

* * * * *